(12) United States Patent
Chahal et al.

(10) Patent No.: US 8,343,806 B2
(45) Date of Patent: Jan. 1, 2013

(54) HERMETIC PACKAGING OF INTEGRATED CIRCUIT COMPONENTS

(75) Inventors: Premjeet Chahal, Gurnee, IL (US); Francis J. Morris, Dallas, TX (US)

(73) Assignee: Raytheon Company, Waltham, MA (US)

( * ) Notice: Subject to any disclaimer, the term of this patent is extended or adjusted under 35 U.S.C. 154(b) by 320 days.

(21) Appl. No.: 12/398,235

(22) Filed: Mar. 5, 2009

(65) Prior Publication Data

US 2010/0224980 A1 Sep. 9, 2010

(51) Int. Cl.
*H01L 21/00* (2006.01)
*H01L 21/20* (2006.01)

(52) U.S. Cl. ........ 438/115; 438/125; 438/126; 438/127; 438/393

(58) Field of Classification Search .................... 438/115
See application file for complete search history.

(56) References Cited

U.S. PATENT DOCUMENTS

| | | | | |
|---|---|---|---|---|
| 5,208,726 | A * | 5/1993 | Apel | 257/532 |
| 5,343,071 | A * | 8/1994 | Kazior et al. | 257/621 |
| 5,352,998 | A * | 10/1994 | Tanino | 333/247 |
| 5,618,752 | A | 4/1997 | Gaul | |
| 5,930,639 | A * | 7/1999 | Schuele et al. | 438/396 |
| 6,586,831 | B2 | 7/2003 | Gooch et al. | |
| 2005/0023558 | A1 * | 2/2005 | Shi | 257/200 |
| 2005/0093397 | A1 * | 5/2005 | Yamada et al. | 310/320 |
| 2006/0199365 | A1 | 9/2006 | Wilner | |
| 2006/0275946 | A1 | 12/2006 | MacNamara et al. | |
| 2007/0057599 | A1 * | 3/2007 | Motai et al. | 310/324 |
| 2007/0210305 | A1 * | 9/2007 | Kim et al. | 257/43 |
| 2008/0035977 | A1 * | 2/2008 | Edward et al. | 257/301 |
| 2008/0079516 | A1 * | 4/2008 | Ruby et al. | 333/189 |
| 2008/0081398 | A1 | 4/2008 | Lee et al. | |
| 2008/0132038 | A1 | 6/2008 | Kameyama et al. | |
| 2008/0312726 | A1 | 12/2008 | Frank et al. | |

OTHER PUBLICATIONS

Process Specialties in "Thermal Oxide", 1999, available on http:///www.processspecialties.com/thermox.htm, pp. 1 and 2.*
Communication from ISA/EPO; PCT—Invitation to Pay Additional Fees and, where applicable, protest fee; 4 pages, Jul. 29, 2010.
Notification of Transmittal of the International Search Report and the Written Opinion of the International Searching Authority, or the Declaration for PCT/US2010/025831 (17 pages), Sep. 10, 2010.

* cited by examiner

*Primary Examiner* — N Drew Richards
*Assistant Examiner* — Michael Jung
(74) *Attorney, Agent, or Firm* — Cantor Colburn LLP (57) ABSTRACT

A method for forming an integrated circuit includes transforming at least a portion of a first substrate layer to form a conductive region within the first substrate layer. An integrated circuit device is provided proximate an outer surface of the first substrate layer. The integrated circuit device transmits or receives electrical signals through the conductive region. A second substrate layer is disposed proximate to the outer surface of the first substrate layer to enclose the integrated circuit device in a hermetic environment.

15 Claims, 5 Drawing Sheets

HERMETIC PACKAGING OF INTEGRATED CIRCUIT COMPONENTS

TECHNICAL FIELD OF THE INVENTION

This invention relates generally to the field of integrated circuits and, more particularly, to hermetic packaging of integrated circuit components.

BACKGROUND OF THE INVENTION

Maintaining a degree of moisture control is desirable for a variety of applications. For example, one application involves devices with electronic circuitry provided within some form of closed housing. The moisture within the closed housing (often caused by humidity) needs to be controlled in order to limit or avoid corrosion of metal within the circuitry or condensation of moisture on exposed circuit lines. Closed housings that are configured to prevent the permeation of moisture are called hermetic packages. Hermetic packaging also prevents the permeation of undesirable gases into the device.

As specific examples, hermetic packaging may be used to prevent humidity and gas permeation in electronic assemblies that contain Radio Frequency (RF) integrated circuits and Microelectromechanical systems (MEMS). MEMS are integrated micro devices or systems combining electrical and mechanical components. MEMS devices may be fabricated using standard integrated circuit batch processing techniques and may have a variety of applications including sensing, controlling, and actuating on the micro scale. MEMS devices may function individually or in arrays to generate effects on a macro scale.

Many RF integrated circuits and MEMS devices benefit from a hermetic environment in order to obtain maximum performance. The hermetic package also provides protection and an optimal operating environment for the devices. However, it is very difficult and very expensive to package such devices.

The I/O connections are the critical areas for hermetic wafer level packaging. For RF connections, the I/O connections must not only be hermetic but must provide the necessary impedance to minimize reflections between the inside of the package and the outside. Typically, these I/O connections are made on the circuit side of the carrier by running insulated leads under or through the hermetic seal. The length of these leads and their electrical interaction with the seal material can significantly degrade the electrical performance. In addition, these connections must be thermally matched to the package materials to assure the package will be hermetic at the operating temperature.

SUMMARY OF EXAMPLE EMBODIMENTS

According to one embodiment of the present invention, a method for forming an integrated circuit includes transforming at least a portion of a first substrate layer to form a conductive region within the first substrate layer. An integrated circuit device is provided proximate an outer surface of the first substrate layer. The integrated circuit device transmits or receives electrical signals through the conductive region. A second substrate layer is disposed proximate to the outer surface of the first substrate layer to enclose the integrated circuit device in a hermetic environment. Historically, integrated circuits are fabricated on silicon wafers, diced into individual circuit chips, and each is then individually mounted inside a package. The I/O's for the chips are bonded to the I/O's of the package. Hermiticity depends on the hermiticity of the package and its I/O's. Conventional hermitic packaging can be many times more expensive than the IC chip itself. Depending on the specific features implemented, however, particular embodiments of the present invention may exhibit some, none, or all of the following technical advantages. A technical advantage of one exemplary embodiment of the present invention is the hermetic packaging of wafers containing the IC's as a single unit and the subsequent separation of the hermetically packaged chips at the completion of the process. Such an approach may significantly reduce the handling of the individual chips and reduce or eliminate the labor for bonding the I/O's of the chips to the package's I/O's. A further technical advantage may be that the fabrication of hermetic vias can be integrated into a standard silicon fab. In addition, completed unpackaged individual chips can be bonded to silicon carrier wafers that incorporate the hermetic vias of certain embodiments of the present invention. This carrier may provide the interconnections to the bonded chips using standard IC technology. The carrier wafer, with hermetic vias fabricated as described herein, can be wafer-level packaged similar to the method described here.

A technical advantage of one exemplary embodiment of the present invention is the formation of RF couplings for performing interconnect functions in hermetically sealed integrated circuit packages. In a particular embodiment, for example, a silicide or other metallized or other conductive region may be formed in a substrate layer to increase the conductive properties of the substrate layer. As another example, a portion of the substrate layer may be transformed to create an oxide or nitride-oxide that may exhibit capacitive characteristics. Thus, the characteristics of the substrate layer may be changed while the hermetic properties of the substrate layer are maintained. Such approaches allow for the use of existing silicon fabrication technology in the formation of hermetic RF packages. Such packaging may include low-loss RF Input/Outputs that perform in the millimeter and sub-millimeter frequency region, in particular embodiments.

As further technical advantages, the techniques used to form RF couplings and interconnects in hermetic packages may be incorporated into optoelectronics, where the silicon is transparent or where the lid (or the substrate material, itself) is transparent. Such approaches may also be applicable to RF module technology, in general. Additionally, three-dimensional stacking may be made possible using these approaches. As still another advantage, as technology pushes for the development of Microwave Monolithic Integrated Circuits (MMICs) operating at higher frequencies, the use of reactive elements to replace contacts becomes more practical.

Other technical advantages may be readily apparent to one skilled in the art from the figures, descriptions and claims included herein. None, some, or all of the examples may provide technical advantages.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF EXAMPLE EMBODIMENTS

Radio Frequency devices such as Microwave Monolithic Integrated Circuits (MMICs), Microelectromechanical systems (MEMS) devices, and other similar devices require a hermetic environment to attain maximum performance. Some circuits require only a hermetic environment in which a controlled atmosphere must be maintained. Other circuits require both a hermetic and vacuum environment. In such circumstances, vacuum-compatible materials processes and equipment must be used during fabrication of these packages. These packaging requirements result in high labor and capital expense and present a significant cost in producing commercially-viable MMICs, MEMS, and other devices. Under many current techniques, the costs of packaging such devices can be 10 to 100 times the basic device fabrication cost, even in reasonably high volume. Additionally, MMIC and MEMS devices are fragile. According to various embodiments of the present invention, special packaging techniques have been developed to hermetically seal the RF devices within a vacuum or controlled environment.

Figure 1:
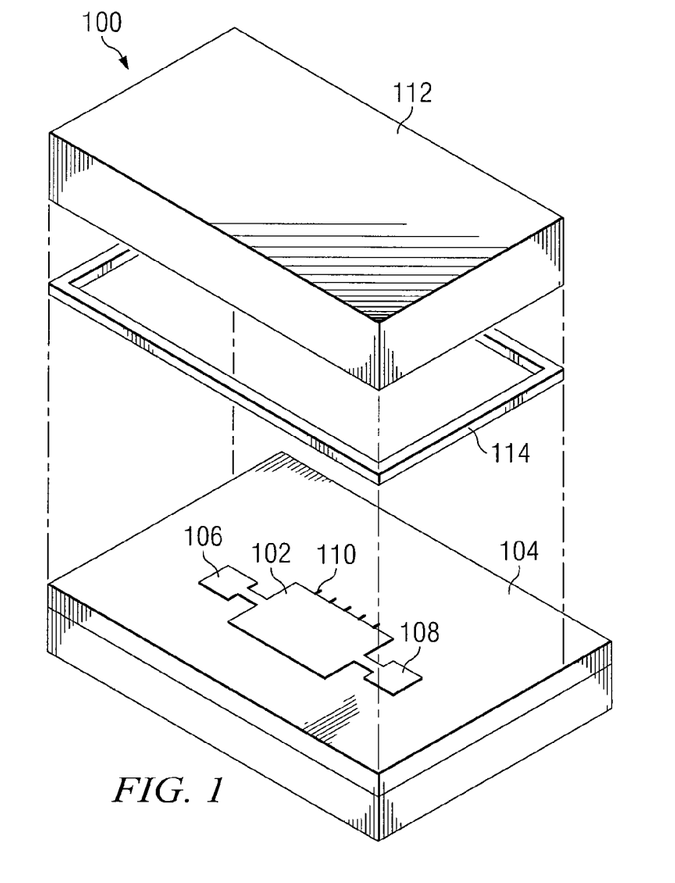
FIG. 1 is a schematic drawing illustrating a hermetically sealed integrated circuit package in accordance with one embodiment of the present invention.

Referring to FIG. 1, a hermetically sealed integrated circuit structure 100 that includes a RF device 102 (hereinafter referred to as integrated device 102) is disposed within a vacuum or controlled environment. Although integrated device 102 may include a MMIC, MEMS device or other micro-device benefiting from a hermetic package, the term integrated device is used herein to refer to these devices including integrated circuit devices, micro-devices, GaAs devices, InP devices, optical devices, MMICs, MEMS devices, or similar devices. In addition, integrated device 102 may include an integrated circuit (IC) or interconnect circuit fabricated on substrate 104 as an integral part of the substrate. In various embodiments, the integrated device 102 is provided proximate an outer surface of a supporting multi-layer substrate structure 104. In particular embodiments, substrate structure 104 may include a silicon layer formed from a standard silicon device wafer or a portion thereof. Silicon, however, is but one example of a suitable substrate layer.

As will be described in more detail below, one or more conductive or capacitive layers may be formed with respect to the outer and inner surfaces of the silicon layer to form Radio Frequency Input/Outputs (RF I/O) 106 and 108, respectively. RF I/O 106 and 108 provide transmission lines for coupling integrated device 102 with components external to integrated circuit structure 100. DC connections 110, which extend through substrate 104, also provide electrical connections from integrated device 102 to a power source external to integrated circuit structure 100.

To form a hermetic package, substrate structure 104 upon which integrated device 102 is supported is mated with a substrate lid 112. Substrate lid 112 may be comprised of a silicon lid wafer; however, any suitable substrate material may be used. The mating of substrate structure 104 and substrate lid 112 may include one or more sealing rings 114 formed on substrate lid 112, substrate structure 104, or both. In particular embodiments, sealing ring(s) 114 may be comprised of gold, lead, glass, or any combination of these or other materials suitable for hermetically mating substrate lid 112 with substrate structure 104. Although sealing rings 114 may have a thickness on the order of approximately 5-40 μms and a width on the order of 100 μm, in particular embodiments, any appropriate thickness and width of sealing rings 114 may be used.

Substrate lid 112 and substrate structure 104 may then be bonded to each other using any known bonding agent, such as a suitable solder, adhesive or other material. In particular embodiments, thermo-compression bonding processes may be used to result in a hermetically-packaged integrated device 102, which is enclosed in a vacuum or controlled environment. Although substrate lid 112 is depicted as including a single piece of substrate material, it is generally recognized that substrate lid 112 may be two or more layers bonded together. Furthermore, although substrate lid 112 generally comprises a substrate material such as silicon, substrate lid 112 could be comprised of metal, glass, or other material sufficient to enclose integrated device 102 in a vacuum or controlled environment. The hermetic and, possibly, vacuum formed within a bonded substrate lid 112 and substrate structure 104 provides protection and an optimal operating environment for integrated device 102 and any other enclosed elements of integrated circuit structure 100.

As will be described in more detail below, packaging formation techniques used to form RF I/Os 106 and 108 of FIG. 1 enable the formation of very small packages to enclose integrated devices 102. According to particular embodiments of the present invention, the packaging formation techniques used to form RF I/Os 106 and 108 may take advantage of the natural hermetic properties of silicides and oxides.

FIGS. 2A-2I illustrate a process flow for the formation of a conductive RF coupling in a hermetically sealed integrated circuit package in accordance with one embodiment. Specifically, FIGS. 2A-2I are cross-sectional views of the formation of a hermetic, conductive connection. The below described process may be integrated into the process flow for an IC or interconnect circuit. The IC/interconnect processes are not described herein and may vary depending on the circuit needs. It is only important that the IC/interconnect processes include the process steps described here for the formation of hermetic vias.

Figure 2A:
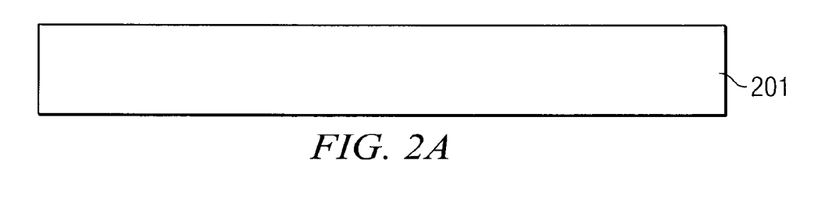
FIGS. 2A-2J illustrate a process flow for the formation of a conductive coupling in a hermetically sealed integrated circuit package in accordance with one embodiment of the present invention.

The technique begins with the formation of a substrate layer 201 as shown in FIG. 2A. As described above, substrate layer 201 may include a silicon wafer on which ICs or interconnect layers are being fabricated. The substrate layer 201 may be of a thickness on the order of approximately 0.025 to 0.010 inches, and may in particular embodiments be of a thickness of approximately 0.017 inches. Although substrate layer 201 may be considered to be a relatively thick layer, the thickness of substrate layer 201 or portions thereof may be selectively reduced by subsequent etching processes.

Figure 2B:
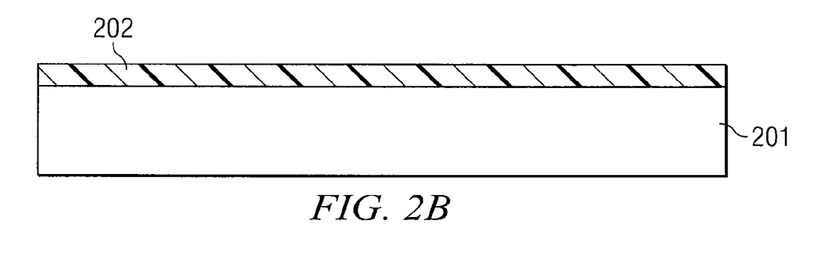

After the formation of substrate layer 201 and as shown in FIG. 2B, a dielectric layer 202 may be grown or deposited to a thickness on the order of approximately 0.1 to 1 microns and, in some example embodiments, may be of a thickness of approximately 0.5 micron. In particular embodiments, dielectric layer 202 may include a thermal oxide that is grown on substrate layer 201 using conventional integrated circuit processes. For example, dielectric layer 202 may be formed by growing an oxide or nitrided oxide layer in a furnace tube at a temperature on the order of approximately 1000° C. for approximately 60 to 180 minutes. In other embodiments, dielectric layer 202 may include a deposited oxide that is formed using conventional chemical vapor deposition (CVD) processes. In CVD processes, thermal energy heats the gases in a coating chamber and drives the deposition reaction. CVD is a method of forming coatings using the decomposition of relatively high vapor pressure gases. Gaseous compounds of the oxide material to be deposited are transported to substrate layer 201 where a thermal reaction/deposition occurs.

Figure 2C:
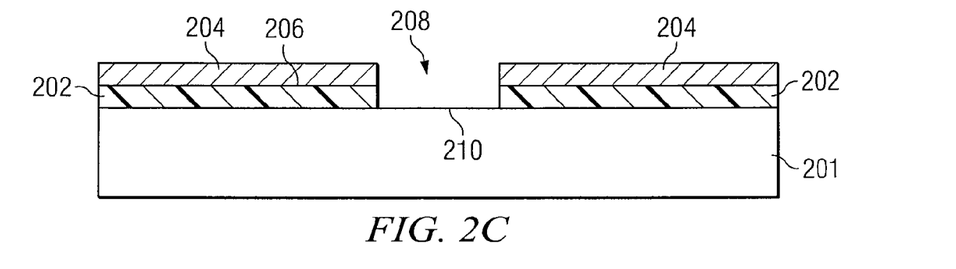

As shown in FIG. 2C, a layer of pattern resist 204 may be deposited on an outer surface 206 of dielectric layer 202 using conventional techniques. In particular embodiments, pattern resist 204 (also known as photo resist) may have a thickness on the order of 0.1 to 10 microns. A portion of pattern resist 204 may be removed using suitable photolithographic methods including photo resist mask and etch techniques to expose a window 208. Accordingly, a portion of outer surface 206 of dielectric layer 202 may be exposed by window 208. Upon exposing window 208 of outer surface 206 of dielectric layer 202, dielectric layer 202 may be selectively etched from window 208 using standard wet chemistry or dry etching processes using gases such as CF4. After the removal of dielectric layer 202 in window 208, the outer surface 210 of substrate 201 may be exposed within window 208. In particular embodiments, window 208 may have a width on the order of approximately 5 to 50 μms.

Figure 2D:
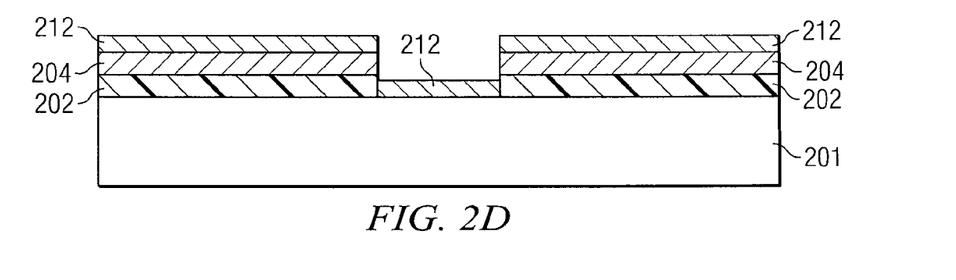

As shown in FIG. 2D, a metal or other conductive layer 212 may be deposited or formed on the outer surface of the pattern resist 214 and in window 208. In particular embodiments, metal layer 212 may be comprised of Cobalt (Co), Hafnium (Hf), Molybdenum (Mo), Niobium (Nb), Nickel (Ni), Palladium (Pd), Platinum (Pt), Tantalum (Ta), Tin (Ti), Vanadium (V), Tungsten (W), and Zirconium (Zr); however, other metal or metal composites exhibiting conductive characteristics and/or suitable for forming a silicide may similarly be used. In various embodiments, metal layer 212 may have a thickness on the order of approximately 0.04 to 2 μm; however, the provided dimensions are merely exemplary and it is recognized that metal layer 212 may be of any appropriate thickness. In still other embodiments, a high concentration dopant may be used in combination with metal layer 212 or in lieu of metal layer 212 to form a doped region within window 208 of substrate layer 201. Such dopants may include Antimony (Sb), Arsenic (As), Boron (B), Phosphorus (P), or another suitable dopant material of opposite polarity than that of substrate 201 to form electrically isolated pockets of heavily doped semiconductor (1.E18-1.E21 dopant ions/cm$^3$).

Figure 2E:
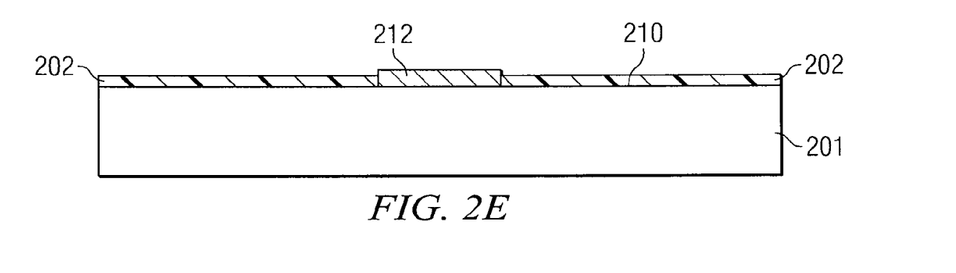
Figure 2F:
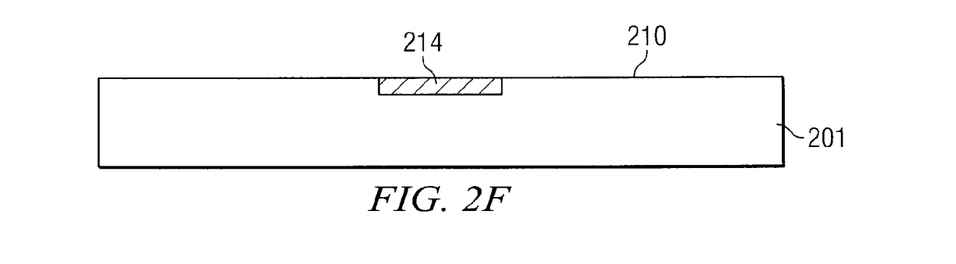

As shown in FIG. 2E, portions of metal layer 212 (along with pattern resist 204) that are outside of window 208 may then be removed leaving a pad of metal layer 212 on the outer surface 210 of substrate layer 201. However, although FIG. 2E depicts dielectric layer 202 being left intact, it is recognized that depending on the subsequent processing needs of the IC 102 or its interconnect dielectric layer 202 can either be removed or not. The structure may then be annealed to react the pad of metal layer 212 with the substrate layer 201. As a result and as shown in FIG. 2F, a metallization of substrate layer 201 may occur and a conductive or metallized region 214 may be formed proximate outer surface 210 of substrate layer 201. In particular embodiments, where the metal layer is comprised of Co, Hf, Mo, Nb, Ni, Pd, Pt, Ta, Ti, V, W, and Zr, the conductive region 214 may include the formation of a silicide such as, for example, $CoSi_2$, $HfSi_2$, $MoSi_2$, $NbSi_2$, $NiSi_2$, $Pd_2Si$, $PtSi$, $TaSi_2$, $TiSi_2$, $VSi_2$, $WSi_2$, $ZrSi_2$, or another silicide, that makes a chemical bond with substrate layer 201. The silicide-substrate chemical bond forms an atomically clean interface which is inherently hermetic. In such an embodiment, metal layer 212 can be removed after the formation of the silicide rather than patterning and etching it prior to the silicide formation. In other embodiments where a dopant is used in lieu of or in addition to metal layer 212, the conductive region 214 comprises a doped region. Regardless of the material used to form conductive region 214, however, the formation of conductive region 214 changes the characteristics of the silicon for the formation of a conductive RF coupling such as that described with regard to FIG. 1.

Figure 2G:
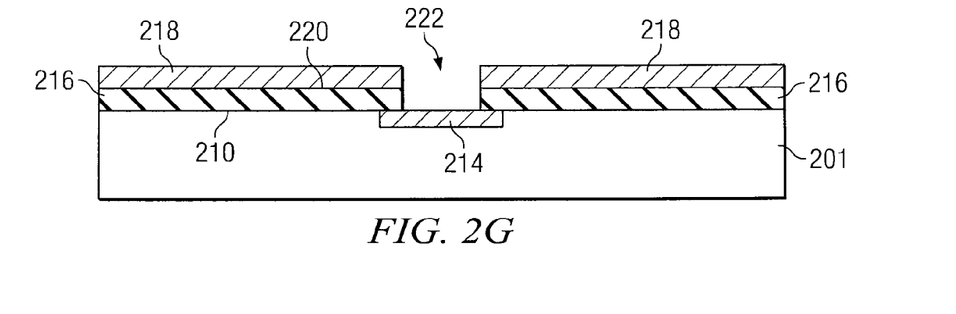

As shown in FIG. 2G, a second dielectric layer 216 may be deposited over metallized region 214 using methods and techniques similar to that described above with regard to dielectric layer 202. A second layer of pattern resist 218 may then be deposited on an outer surface 220 of second dielectric layer 216 using conventional techniques. In particular embodiments, pattern resist 218 (also known as photo resist) may have a thickness on the order of 0.1 to 10 microns. A portion of pattern resist 218 may be removed using suitable photolithographic methods including photo resist mask and etch techniques to expose a second window 222. Second window 222 may be aligned such that it is nested inside and above the conductive, metallized region 214. Upon exposing window 222 the second dielectric layer 216 may be selectively etched from window 222 using standard wet chemistry or dry etching processes using gases such as CF4.

Figure 2H:
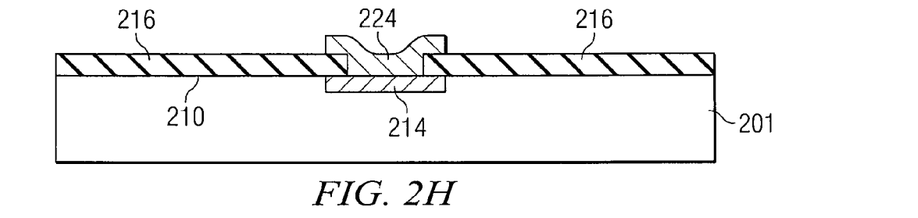

As shown in FIG. 2H, a metal contact 224 may then be formed in the window 222. Metal contact 224 may be proximate to outer surface 210 of substrate layer 201. In particular embodiments, metal contact 224 may be comprised of a layer of Aluminum that is on the order of 1 to 5 microns in thickness; however, other metal materials of other example thicknesses may be used without departing from the scope of the invention.

Figure 2I:
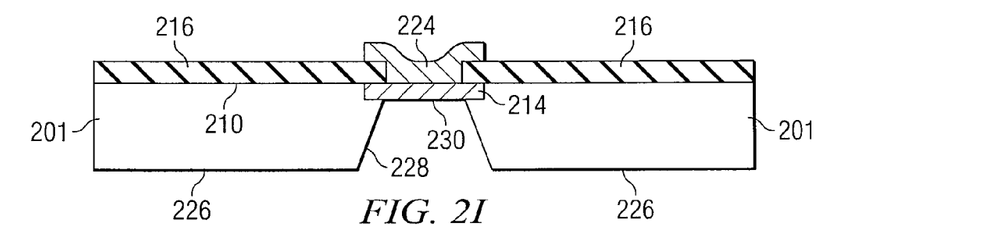
Figure 2J:
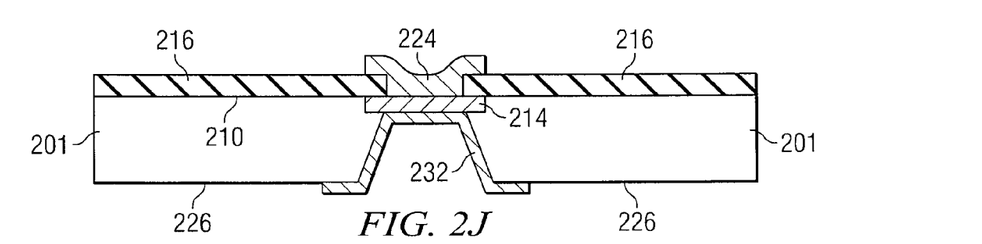

After the formation of metal contact 224, the underside surface 226 of substrate layer 201 may be processed as shown in FIG. 2I. Such processes may include the formation of a via 228 in underside surface 226. Via 228 may be formed using conventional wet or dry etch processes and may form a trench through a portion of substrate layer 201. In a particular embodiment, via 228 may be etched in two steps. The first step may use an aggressive etch such as KOH and etch from the surface 226 to a position close to the underside of conductive region 214. This would be followed by a selective etch which would stop on the conductive region 214. Such etches are known to those knowledgeable in the field. In other embodiments, instead of wet chemical etching of the substrate, a combination of plasma (dry) etching and wet chemical etching or plasma etching alone of the substrate can be used.

After the completion of the backside via 228, a dielectric layer (not shown) such as silicon nitride or silicon oxide may be deposited over the back side of the wafer and in Via 228. This dielectric layer may then be patterned using standard photoresist techniques to expose openings in the resist inside of Via 228. This dielectric layer provides isolation between the subsequent conductive layer 232 and the substrate 201. As illustrated, via 228 exposes an underside surface 230 of conductive region 214. Via 228 may then be partially filled with one or more conductive via layers 232. In particular embodiments, for example, conductive via layer 232 may include one or more layers of aluminum (Al), gold (Au), TiW, Moly, Tin, Copper (Cu), or other metals. Conductive via layer 232 may be of a thickness on the order of 1 to 5 microns, in particular embodiments. In operation, conductive via layer 232, conductive region 214, and metal contact 224 operate to pass current through the hermetic via and provide a connection from the top of substrate 201 to the backside of substrate 201. Thus, the components operate to form a conductive RF coupling and dc connections for any integrated device(s) supported by substrate layer 201.

Using the processes described above or similar processes, the characteristics of substrate layer 201 are changed to exhibit conductive properties. Packing processes that incorporate these techniques may provide hermetically sealed integrated circuits that take advantage of the inherently hermetic properties of silicon. The provision of a conductive region 214 within substrate layer 201, specifically, eliminates the need to form a via through the entire substrate layer 201. As a result, the occurrence of voids and other deformities that result from etch and fill processes may be reduced. Although Palladium and Platinum are described above as providing the material for the formation of a silicide in conductive region 214, other examples of silicides that may form conductive region 214 include $CoSi_2$, $HfSi_2$, $MoSi_2$, $NbSi_2$, $NiSi_2$, $Pd_2Si$, $PtSi$, $TaSi_2$, $TiSi_2$, $VSi_2$, $WSi_2$, $ZrSi_2$ and the metal of metal layer 212 may be chosen accordingly.

The process flow and resulting configuration of FIGS. 2A-2J are merely one example of a conductive coupling that may be formed in substrate layer 201. Many variations to the illustrated and described configuration of the conductive RF coupling are within the scope of the present invention. For example, although the integrated circuit structure of FIGS. 2A-2J are not shown to include the lid layer 112 that was described above with regard to FIG. 1, it is recognized that the underside processes described herein may be performed prior to the bonding of a lid layer to substrate layer 112 to hermetically seal an integrated device on the surface of substrate layer 201. Alternatively, the underside processes may be performed after the lid layer has been adhered to substrate layer 112 such that any integrated devices are protected during the subsequent semiconductor processes.

Figure 3:
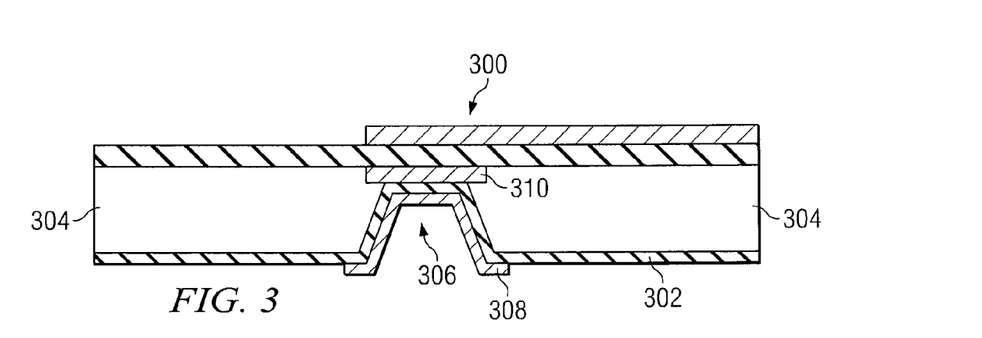
FIG. 3 is a cross-sectional drawing illustrating a conductive coupling for a hermetically sealed integrated circuit package in accordance with an alternative embodiment of the present invention.

As another example, FIG. 3 illustrates a RF coupling 300 for a hermetically sealed integrated circuit package in accordance with an alternative embodiment of the present invention. In the illustrated embodiment, a dielectric layer 302 is deposited on the underside surface of substrate layer 304 after the formation of via 306. Dielectric layer 302 may be comprised of Plasma oxide, Plasma nitride, or another suitable dielectric material. Because dielectric layer 302 is formed in via 306, conductive via layer 308 is separated from conductive region 310 by dielectric layer 302. The inclusion of the dielectric layer 302 does not inhibit RF coupling 300 from operating as intended, however, since it is not necessary for the metal layers to contact one another in an RF coupling.

In another embodiment, the RF coupling may include a capacitive coupling formed by two capacitors positioned on opposite surfaces of the substrate layer. FIGS. 4A-4E illustrate a process flow for the formation of a capacitive coupling 400 in a hermetically sealed integrated circuit package in accordance with one embodiment of the present invention. Similar to the conductive coupling of FIGS. 2A-2J, the technique begins with the formation of a substrate layer 401. As described above, substrate layer 401 may include a silicon layer that is formed from a standard silicon device wafer or a portion thereof. Substrate layer 401 may be of a thickness on the order of approximately 0.010 to 0.50 inches, and may in particular embodiments be of a thickness of approximately 0.017 inches. Although substrate layer 401 may be considered to be a relatively thick layer, the thickness of substrate layer 401 or portions thereof may be reduced by subsequent coupling formation processes.

Figure 4A:
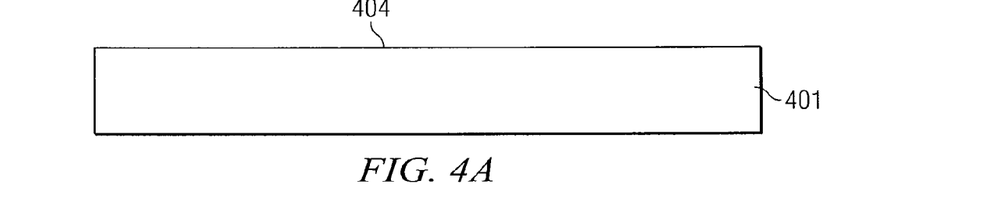
FIGS. 4A-4E illustrate a process flow for the formation of a capacitive coupling in a hermetically sealed integrated circuit package in accordance with one embodiment of the present invention.
Figure 4B:
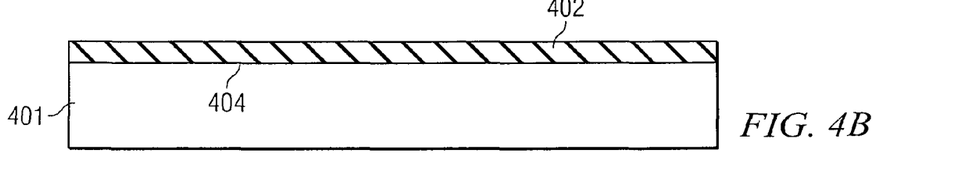

A portion of substrate layer 401 may then be transformed into a dielectric region 402. As illustrated, dielectric region 402 is proximate the outer surface 404 of substrate layer 401 and operates as part of a capacitor to transfer electrical signals to and from an integrated circuit device (not shown). Dielectric region 402 may be of a thickness on the order of approximately 0.2 to 2 microns, in some example embodiments, and may be of a thickness of approximately 1 micron, in a particular embodiment. Dielectric region 402 may include a thermal oxide that is grown on substrate layer 401 using conventional thermal oxidation processes. For example, dielectric region 402 may be formed by growing an oxide or nitrided oxide layer in a furnace tube at a temperature on the order of approximately 1000° C. In other embodiments, dielectric region 402 may include a deposited oxide that is formed using conventional chemical vapor deposition (CVD) processes, as described above. The thickness of dielectric region 402 may be increased where other dielectrics are deposited either before or after the formation of dielectric region 402 or decreased by selectively removing any dielectric formed prior to the formation of dielectric region 402. The other dielectric layers may be deposited using sputtering, evaporation, or CVD processes or any combination thereof.

Figure 4C:
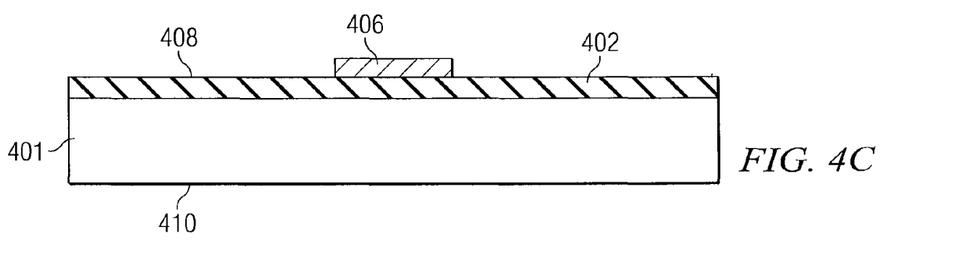

Following the formation of dielectric region 402, photo resist mask and etch techniques (similar to those described above with regard to FIGS. 2 and 3) may be used to form a first electrode 406 proximate to outer surface 408 of dielectric region 402. The first electrode 406 may be comprised of a layer of Gold, Aluminum, or other conductive metal that is on the order of 0.1 to 5 microns in thickness. Other metal materials of other example thicknesses may be used, however, without departing from the scope of the invention. Additionally, it is recognized that several metal layers may be used to attain optimum low-loss connection and good hermeticity within an integrated circuit package.

Figure 4D:
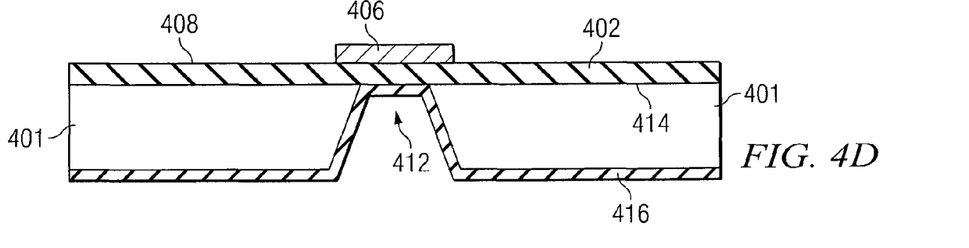

After the formation of first electrode 406, the underside surface 410 of substrate layer 401 may be processed, in particular embodiments. Such processes may include the formation of a via 412 in underside surface 410. Via 412 may be formed using conventional wet or dry etch processes similar to that described previously. Via 412 forms a trench through a portion of substrate layer 401. As illustrated via 412 exposes an underside surface 414 of dielectric region 402. Via 412 may then be partially filled with one or more dielectric layers 416 that is deposited or grown, using the processes described above or other semiconductor processes. In some instances, no dielectric 416 may be required. In particular embodiments, dielectric layer 416 may be comprised of an oxide that is deposited on underside surface 410 of substrate layer 401.

Figure 4E:
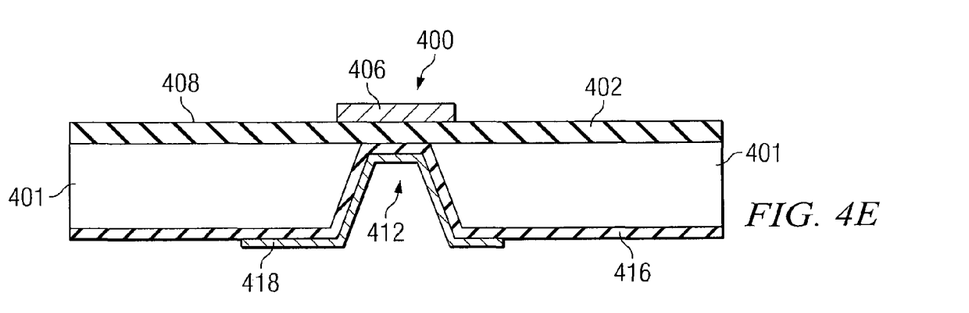

Following the formation of dielectric layer 416, via 412 may be partially filled with one or more conductive via layers to form a second electrode 418. In particular embodiments, for example, second electrode 418 may include one or more layers of aluminum, gold, or a combination thereof. Again, it is recognized that several metal layers may be used, in particular embodiments, to attain optimum low-loss connection and good hermeticity within an integrated circuit package. Second electrode 418 may be of a thickness on the order of 1 to 5 microns.

Using the above-described techniques, a capacitive RF coupling 400 may be formed and may operate to pass RF current through the via from one integrated circuit component to another. Packaging processes that incorporate these techniques for forming a capacitive RF coupling also may be incorporated into hermetically sealed integrated circuits and may operate to take advantage of the inherently hermetic properties of silicon. The process flow and resulting configuration of FIG. 4, however, is merely one example of a capacitive RF coupling 400 that may be formed in substrate layer 401. Many variations to the illustrated and described configuration of the capacitive RF coupling 400 are within the scope of the present invention.

Figure 5:
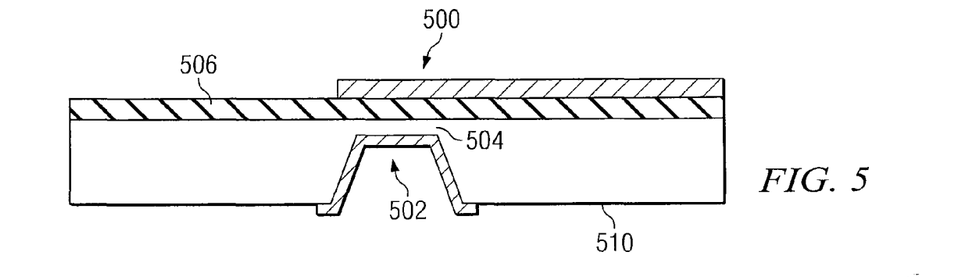
FIG. 5 is a cross-sectional drawing illustrating a capacitive coupling for a hermetically sealed integrated circuit package in accordance with an alternative embodiment of the present invention.

As another example of a possible modification, FIG. 5 illustrates a capacitive RF coupling 500 for a hermetically sealed integrated circuit package in accordance with an alternative embodiment of the present invention. In the illustrated embodiment, via 502 is formed only through a portion of substrate layer 504. Accordingly, a portion of substrate layer 504 proximate dielectric layer 506 remains on underside surface 510 of substrate layer 504. Such an embodiment, takes further advantage of the hermetic properties of substrate layer 504. This approach will require that the silicon substrate 510 be highly resistive in the region of via 502 such that electrically it performs as a dielectric. This approach provides added strength to the via 502, which might be important for vacuum applications.

It should be pointed out that with either of the hermetic conductive or capacitive via structures described, modifications may be made to the described structure. For example, multiple via connections may be formed in a single bottom side by selective patterning.

Figure 6A:
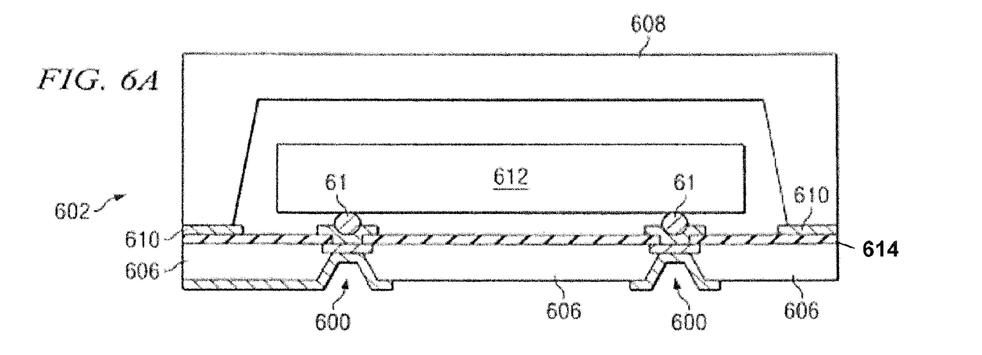
FIGS. 6A and 6B are schematic diagrams illustrating alternative approaches to conductively coupling integrated devices within a hermetically sealed integrated circuit package in accordance with certain embodiments of the present invention.
Figure 6B:
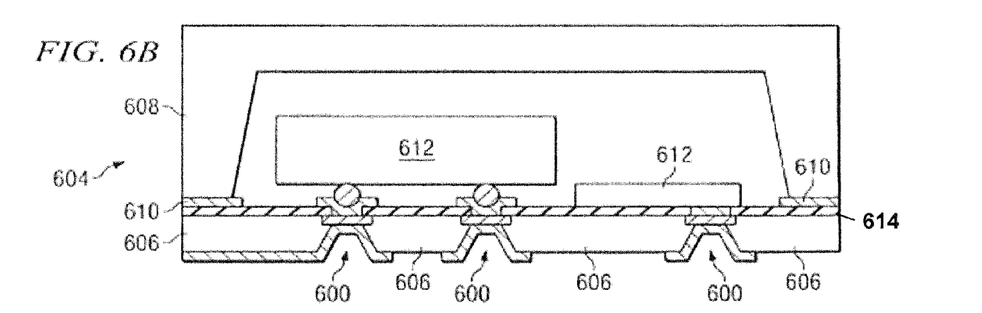

FIGS. 6A and 6B are schematic diagrams illustrating further alternative approaches to conductively coupling integrated devices within a hermetically sealed integrated circuit package in accordance with certain embodiments of the present invention. Specifically, FIGS. 6A and 6B illustrate the incorporation of conductive RF couplings 600 into hermetically sealed integrated circuit packages 602 and 604, respectively. In each of the illustrated embodiments, the integrated circuit packages 602 and 604 include a supporting multi-layer substrate structure 606 through which conductive RF couplings 600 are formed. Each embodiment also includes a substrate lid 608 that is mated with multi-layer substrate structure 606. Similar to substrate lid 112 described above with respect to FIG. 1, substrate lids 608 may be comprised of silicon lid wafers; however, any suitable substrate material may be used. Although conductive RF couplings 600 are specifically illustrated, it is recognized that capacitive RF couplings may alternatively or additionally be used. Accordingly, any of the above described RF couplings (such as, for example, those that may be formed using the process flows described above with regard to FIGS. 2 and 4) may be used to form RF couplings 600.

The mating of substrate structure 606 and substrate lid 608 may include one or more sealing rings 610 formed on substrate lid 608, substrate structure 606, or both. As described above, sealing ring(s) 610 may be comprised of gold, lead, glass, or any combination of these or other materials suitable for hermetically mating substrate lid 608 with substrate structure 606. In particular embodiments, thermo-compression bonding processes may be used to result in hermetically-packaged integrated packages 602 and 604. In addition, the sealing ring 610 can be formed using an organic film that can be hermetically bonded to substrate 606 and substrate lid 608. The vacuum or controlled environment formed within a bonded substrate lid 608 and substrate structure 606 provides protection and an optimal operating environment for integrated devices 612 and any other enclosed elements of integrated circuit structures 602 and 604.

In the illustrated embodiments, integrated circuit structure 602 includes a single integrated device 612. By contrast, integrated circuit structure 604 includes two integrated devices 612. It is generally recognized that integrated circuit structure 604 may include any combination of an integrated devices formed within a single hermetic package. As described above, integrated devices 612 may include integrated circuit devices, micro-devices, GaAs devices, InP devices, optical devices, MMICs, MEMS devices, or other micro-devices benefiting from hermetic packaging. As illustrated in FIGS. 6A and 6B, integrated devices 612 may be supported by one or more dielectric layers 614 formed proximate the conductive RF coupling 600, in particular embodiments. In other embodiments, an integrated device 612 may be formed on the substrate itself such that integrated device 612 rests directly on conductive RF coupling 600, as illustrated in FIG. 6B. In still other embodiments, integrated devices 612 may be flip-chip mounted using connections 61, or wire bonded on substrate layer 606.

Figure 7:
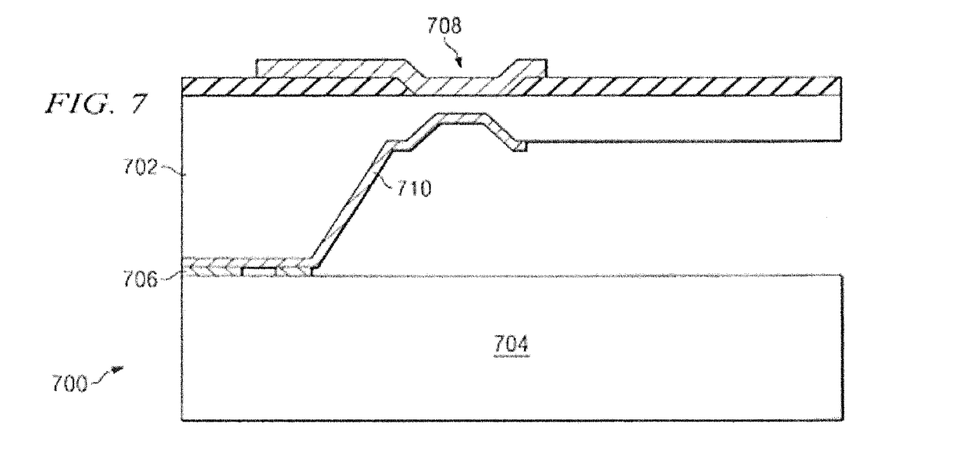
FIG. 7 is a cross-sectional drawing illustrating the use of a conductive coupling in accordance with still another embodiment of the present invention.

Although the above-described embodiments include the mating of two substrate layers to enclose an integrated device in a hermetic environment, still other embodiments may include merely one substrate layer that directly mates with a surface of an integrated circuit. FIG. 7 illustrates one example packaging configuration 700 of such an embodiment. Specifically, FIG. 7 depicts a single substrate layer 702 that mates directly with an integrated circuit device 704. Similar to the examples described above, one or more sealing rings 706 formed on the surface of substrate layer 702 operate to form a hermetic seal with integrated circuit device 704. In the illustrated embodiment, a RF coupling 708 is formed through substrate layer 702. Although a conductive RF coupling 708 is specifically illustrated, it is recognized that a capacitive RF coupling may alternatively be used. Accordingly, any of the above described RF couplings (such as, for example, those that may be formed using the process flows described above with regard to FIGS. 2 and 4) may be used to form RF coupling 708. A metal layer 710 provides electrical connection from RF coupling 708 to integrated circuit device 704.

Depending on the specific features implemented, particular embodiments of the present invention may exhibit some, none, or all of the following technical advantages. A technical advantage of one exemplary embodiment of the present invention is the formation of RF couplings for performing innerconnect functions in hermetically sealed integrated circuit packages. In a particular embodiment, for example, a silicide or other metallized or other conductive region may be formed in a substrate layer to increase the conductive properties of the substrate layer. As another example, a portion of the substrate layer may be transformed to create an oxide or nitride-oxide that may exhibit capacitive characteristics. Thus, the characteristics of the substrate layer may be changed while the hermetic properties of the substrate layer are maintained. Such approaches allow for the use of existing silicon fabrication technology in the formation of hermetic RF packages. Such packaging may include low-loss RF I/O that perform in the millimeter and sub-millimeter frequency region, in particular embodiments.

As further technical advantages, the techniques used to form RF couplings and innerconnects in hermetic packages may be incorporated into optoelectronics, where the silicon is transparent or where the lid (or the substrate material, itself) is transparent. Such approaches may also be applicable to RF module technology, in general. Additionally, three-dimensional stacking may be made possible using these approaches. As still another advantage, as technology pushes for the development of MMICs operating at higher frequencies, the use of reactive elements to replace contacts becomes more practical.

Although the present invention has been described in detail, it should be understood that various changes, alterations, substitutions, and modifications can be made to the teachings disclosed herein without departing from the spirit and scope of the present invention which is solely defined by the appended claims.

What is claimed is:

1. A method for forming a hermetically-packaged integrated circuit, comprising:
using a thermal process to transform a portion of a first substrate layer into a dielectric region, the dielectric region disposed proximate an outer surface of the first substrate layer and forming an intermediary layer between a first metal layer of a capacitor and a second metal layer of the capacitor, the first metal layer of the capacitor disposed proximate the outer surface of the first substrate layer, the second metal layer of the capacitor disposed proximate an underside surface of the first substrate layer;
providing an integrated circuit device proximate the outer surface of the first substrate layer, the integrated circuit device operable to transmit or receive electrical signals via the first metal layer, the second metal layer, and the dielectric region of the capacitor;
forming one or more additional dielectric layers proximate the outer surface of the first substrate layer to increase the thickness of the dielectric region; and
disposing a second substrate layer proximate to the outer surface of the first substrate layer to enclose the integrated circuit device in a hermetic environment.

2. The method of claim 1, wherein using the thermal process comprises:
placing the first substrate layer in a furnace tube; and
growing the dielectric region.

3. The method of claim 1, wherein the first substrate comprises silicon, and wherein using the thermal process comprises using a thermal oxidization process to transform the portion of the first substrate layer into oxidized silicon.

4. The method of claim 1, wherein the integrated circuit device comprises one of: a GaAs device, an InP device, a Microwave Monolithic Integrated Circuit (MMIC), and a Microelectromechanical systems (MEMS) device.

5. The method of claim 1, wherein:
the first metal layer comprises a first electrode;
the second metal layer comprises a second electrode; and
the dielectric region forms the intermediary layer between the first electrode and the second electrode.

6. The method of claim 1, wherein each of the first and second metal layers comprise one or more of: cobalt (Co), hafnium (Hf), molybdenum (Mo), niobium (Nb), nickel (Ni), palladium (Pd), platinum (Pt), tantalum (Ta), titanium (Ti), vanadium (V), tungsten (W), and zirconium (Zr).

7. A method for forming a hermetically-packaged integrated circuit, comprising:
using a thermal process to transform a portion of a first substrate layer into a dielectric region, the dielectric region disposed proximate an outer surface of the first substrate layer and forming an intermediary layer between a first metal layer of a capacitor and a second metal layer of the capacitor, the first metal layer of the capacitor disposed proximate the outer surface of the first substrate layer, the second metal layer of the capacitor disposed proximate an underside surface of the first substrate layer;
performing an etch process on the underside surface of the first substrate layer to form a via through a portion of the first substrate layer;
at least partially filling the via with a first dielectric layer;
providing an integrated circuit device proximate the outer surface of the first substrate layer, the integrated circuit device operable to transmit or receive electrical signals via the first metal layer, the second metal layer, and the dielectric region of the capacitor; and
disposing a second substrate layer proximate to the outer surface of the first substrate layer to enclose the integrated circuit device in a hermetic environment.

8. The method of claim 7, wherein performing the etch process exposes an underside surface of the dielectric region.

9. A method for forming a hermetically-packaged integrated circuit, comprising:
using a thermal process to transform a portion of a first substrate layer into a first dielectric region, the first dielectric region disposed proximate an outer surface of the first substrate layer;
forming a first metal layer proximate the outer surface of the first substrate layer to form a first electrode of a capacitor;
forming a second dielectric region within a recessed portion of the first substrate layer, the second dielectric layer region between the first dielectric region and the second electrode;
forming a second metal layer proximate an underside surface of the first substrate layer to form a second electrode of the capacitor, the first and second dielectric regions forming an intermediary layer between the first and second metal layers of the capacitor;
providing an integrated circuit device proximate the outer surface of the first substrate layer, the integrated circuit device operable to transmit or receive electrical signals via the first metal layer, the second metal layer, and the first and second dielectric regions of the capacitor; and
disposing a second substrate layer proximate to the outer surface of the first substrate layer to enclose the integrated circuit device in a hermetic environment.

10. The method of claim 9, wherein each of the first and second metal layers comprise one or more of: cobalt (Co), hafnium (Hf), molybdenum (Mo), niobium (Nb), nickel (Ni), palladium (Pd), platinum (Pt), tantalum (Ta), titanium (Ti), vanadium (V), tungsten (W), and zirconium (Zr).

11. A method for forming a hermetically-packaged integrated circuit, comprising:
using a thermal process to transform a first portion of a substrate layer into a first dielectric region, and forming a second dielectric region within a recessed second portion of the substrate layer, the first and second dielectric layer regions forming an intermediary layer between a first metal layer of a capacitor and a second metal layer of the capacitor, the first metal layer of the capacitor disposed proximate an outer surface of the first substrate layer, the second metal layer of the capacitor disposed proximate an underside surface of the first substrate layer; and
mating the substrate layer with a surface of an integrated circuit device to create a hermetic environment between the surface of the integrated circuit device and the substrate layer, the integrated circuit device operable to transmit or receive electrical signals via the first metal layer, the second metal layer, and the first and second dielectric regions of the capacitor.

12. The method of claim 11, wherein:
the first metal layer comprises a first electrode;

the second metal layer comprises a second electrode; and the first and second dielectric regions form the intermediary layer between the electrode and the second electrode.

13. The method of claim 11, wherein each of the first and second metal layers comprise one or more of: cobalt (Co), hafnium (Hf), molybdenum (Mo), niobium (Nb), nickel (Ni), palladium (Pd), platinum (Pt), tantalum (Ta), titanium (Ti), vanadium (V), tungsten (W), and zirconium (Zr).

14. A method for forming a capacitive coupling for an integrated circuit substrate, the method comprising:

forming a first dielectric layer on a first surface of the integrated circuit substrate;

forming a first electrode over the first dielectric layer;

recessing a portion of a second surface of the integrated circuit substrate, the second surface being opposite the first surface;

forming a second dielectric layer within the recessed portion, the second dielectric layer disposed between the first dielectric layer and the second electrode; and forming a second electrode within the recessed portion, thereby defining a capacitor comprising the first electrode, the first dielectric layer, the second dielectric layer and the second electrode.

15. The method of claim 14, wherein the recessed portion extends completely through the integrated circuit substrate such that a portion of the second dielectric layer is in contact with a portion of the first dielectric layer.

* * * * *